United States Patent
Schaffer

(10) Patent No.: US 8,829,996 B1
(45) Date of Patent: Sep. 9, 2014

(54) HIGH VOLTAGE MOS INPUT STAGE

(71) Applicant: Touchstone Semiconductor, Inc., Milipitas, CA (US)

(72) Inventor: Gregory L. Schaffer, Cupertino, CA (US)

(73) Assignee: Silicon Laboratories Inc., Austin, TX (US)

( * ) Notice: Subject to any disclaimer, the term of this patent is extended or adjusted under 35 U.S.C. 154(b) by 15 days.

(21) Appl. No.: 13/873,873

(22) Filed: Apr. 30, 2013

Related U.S. Application Data

(60) Provisional application No. 61/807,831, filed on Apr. 3, 2013.

(51) Int. Cl.
*H03F 3/45* (2006.01)
*H03F 1/52* (2006.01)

(52) U.S. Cl.
CPC ..................... *H03F 1/523* (2013.01)
USPC .......................... 330/261; 330/257

(58) Field of Classification Search
CPC ........................................................ H03F 3/45
USPC .............................................. 330/261, 257, 253
See application file for complete search history.

(56) References Cited

U.S. PATENT DOCUMENTS

| | | | |
|---|---|---|---|
| 6,275,109 B1 * | 8/2001 | Tang | 330/261 |
| 6,559,719 B2 * | 5/2003 | Sakuragi | 330/252 |
| 7,310,017 B2 * | 12/2007 | Etou | 330/253 |
| 8,531,242 B2 * | 9/2013 | Chung | 330/255 |

* cited by examiner

*Primary Examiner* — Henry Choe
(74) *Attorney, Agent, or Firm* — Gary Stanford

(57) ABSTRACT

A differential input stage including two input branches each with a pair of transistors. A bias circuit supplies a separate bias current to each of the input branches. A first transistor of each branch has a first current terminal coupled to a source node receiving a bias current, a second current terminal coupled to an output node, and a control terminal coupled to an input node. A second transistor of each branch has a first current terminal coupled to the corresponding source node, a control terminal coupled to the corresponding input node, and a second current terminal coupled to an intermediate node. The second transistors operate as a current path in higher differential voltage conditions to keep the first transistor active to avoid violating the maximum gate-source voltage.

22 Claims, 3 Drawing Sheets

HIGH VOLTAGE MOS INPUT STAGE

CROSS-REFERENCE TO RELATED APPLICATIONS

This application claims the benefit of U.S. Provisional Application Ser. No. 61/807,831, filed on Apr. 3, 2013, which is hereby incorporated by reference in its entirety for all intents and purposes.

BACKGROUND OF THE INVENTION

1. Field of the Invention

The present invention relates in general to a MOS differential input stage, and more particularly to a high voltage MOS differential input stage incorporating input gate protection.

2. Description of the Related Art

Years ago, 15 Volt (V) MOS field-effect transistors (MOSFETs) had thick gate oxides in which the breakdown voltage of the gate oxide exceeded the drain-source breakdown voltage. There was not a problem with rupturing the gate oxide of amplifiers or comparators having input stages that used these earlier MOSFET configurations. As oxides got thinner, the breakdown voltage got smaller. Eventually, DMOS (double-diffused MOS) transistors came out that had higher voltages. But there was a problem inasmuch as the operating voltage of the FETs, such as, for example, 40V, was far greater than the rated breakdown voltage of the gate oxides for these devices.

One solution to this problem was to add back-to-back external diodes across the input pair. This worked for some amplifier applications but not for comparators in which one input might be connected to a voltage reference while the other input might be at any voltage. Conventional methods have been proposed for solving this problem with internal designs in which the input transistor devices are operated as source followers. Then the voltages at their sources became a new input signal pair for an internal amplifier that was configured to handle large input voltage differences. The conventional methods have been complicated in that they require significant design effort for each implementation.

JFET (junction FET) amplifiers have also been available. Although JFETs do not have a gate oxide breakdown problem, they do incorporate fairly large diodes that leak current, especially at high temperatures, and are thus undesirable for many applications.

SUMMARY OF THE INVENTION

A differential input stage including first and second input circuits, a load circuit and a bias circuit. The first input circuit includes first and second transistors. The first transistor has a first current terminal coupled to a first source node, a second current terminal coupled to a first output node, and a control terminal coupled to a first input node. The second transistor has a first current terminal coupled to the first source node, a second current terminal coupled to an intermediate node, and a control terminal coupled to the first input node. The second input circuit includes third and fourth transistors. The third transistor has a first current terminal coupled to a second source node, a second current terminal coupled to a second output node, and a control terminal coupled to a second input node. The fourth transistor has a first current terminal coupled to the second source node, a second current terminal coupled to the intermediate node, and a control terminal coupled to the second input node. The load circuit is coupled between the first and second output nodes and a first supply node. The bias circuit is coupled to the first supply node and a second supply node and develops a first bias current at the first source node and a second bias current to the second source node.

The transistors may be implemented as PMOS transistors or NMOS transistors or the like. The transistors may each be implemented with a thin gate oxide. The W/L ratio of the second and fourth transistors may be different than the W/L ratio of the first and third transistors. For example, the W/L ratio of the inner transistors coupled to the intermediate node may be made with a larger W/L ratio than the outer transistors to increase the voltage swing at the output. In a particular embodiment, the inner transistors are short channel field-effect transistors. The differential input stage may be used as the input stage of an amplifying device, such as an amplifier or comparator or the like.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The benefits, features, and advantages of the present invention will become better understood with regard to the following description, and accompanying drawings. The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
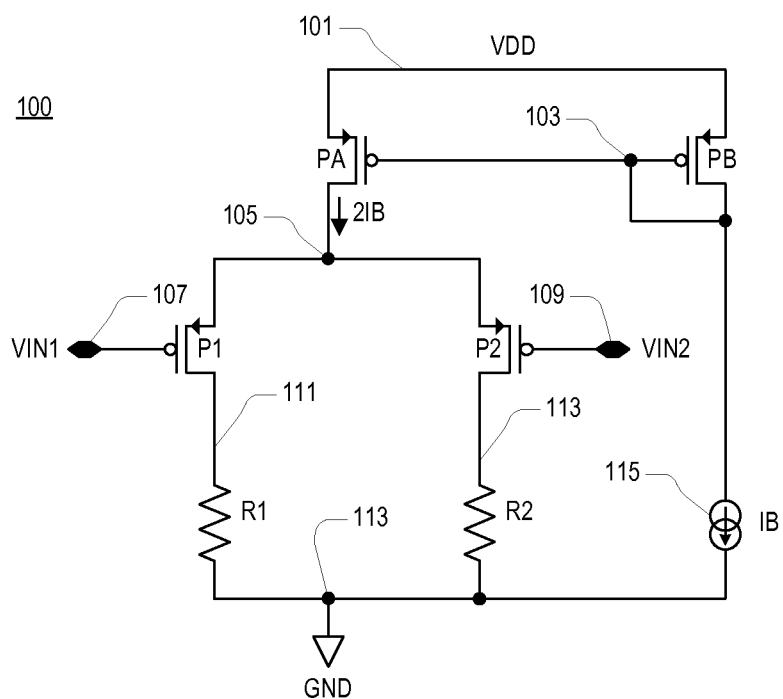
FIG. 1 is a schematic diagram of a conventional MOS differential input stage.

FIG. 1 is a schematic diagram of a conventional MOS differential input stage 100. The MOS differential input stage 100 includes P-type or P channel MOS (PMOS) devices (or FETs) PA, PB, P1 and P2, a bias current source 115, and load resistors R1 and R2. A supply node 113 is a reference node with any suitable positive, negative or ground supply voltage level. In the illustrated embodiment, the supply node 113 is coupled to a reference supply voltage level, such as ground (GND) having a voltage level of 0 Volts (V). A supply node 101 receives and provides a supply voltage VDD, which is any suitable supply voltage level. In one embodiment, VDD is 12V although other supply voltage levels are contemplated. In the illustrated embodiment, PA, PB, P1 and P2 are rated at about 18V (source to drain), but the gate-source voltages of these devices have a maximum operating voltage range of 5V due to their thin gate oxides.

The sources of PA and PB are coupled to VDD, and the gate and drain of diode-coupled PB is coupled to a bias node 103, which is further coupled to the gate of PA. The bias current source 115 is coupled between nodes 103 and 113 to draw a bias current IB from node 103 to the GND node 113.

The drain of PA is coupled to a source node 105, which is further coupled to the sources of P1 and P2. The gate of P1 receives an input voltage VIN1 at input node 107 and its drain is coupled to one end of the load resistor R1 at a first output node 111. The gate of P2 receives an input voltage VIN2 at input node 109 and its drain is coupled to one end of the load resistor R2 at a second output node 113. The other ends of the load resistors R1 and R2 are coupled to GND at node 113.

The PMOS devices PA and PB are coupled in a mirror configuration so that the bias current IB developed by the bias current source 115 is mirrored into the source node 105. In the illustrated embodiment, PA is sized relative to PB to double the bias current IB to provide a bias current 2IB to the source node 105. In one embodiment, for example, PA is twice the size of PB (or is configured with twice as many parallel-coupled devices of the same size) to double the bias current through PA.

As understood by those of ordinary skill in the art, VIN1 and VIN2 apply a differential input voltage between input nodes 107 and 109 and a corresponding differential output voltage is developed between output nodes 111 and 113. A significant and known problem of the conventional MOS differential input stage 100 is that if a substantial voltage difference is applied between VIN1 and VIN2, the maximum gate-source voltage rating of at least one of the input PMOS devices P1 and P2 is exceeded thereby damaging that PMOS device.

Suppose, for example, that VIN2 is pulled low to GND and VIN1 is pulled high to 10V in the 12V configuration. Since the gate of P1 is reverse biased, P1 is shut off. Thus, substantially all of the bias current of 2IB from PA flows through the source and drain of P2 to the load resistor R2. Since VIN2 is at 0.0V, the source voltage of P2 is at about 1V. The source of P1 is also connected to the source of P2, so that P1 has a gate-source voltage of 10V−1V=9V. This exceeds the 5V oxide voltage rating of P1, which would likely cause the oxide to rupture thereby damaging P1. A similar result occurs when the voltages are reversed likely rupturing the oxide of P2 thus damaging P2.

Figure 2:
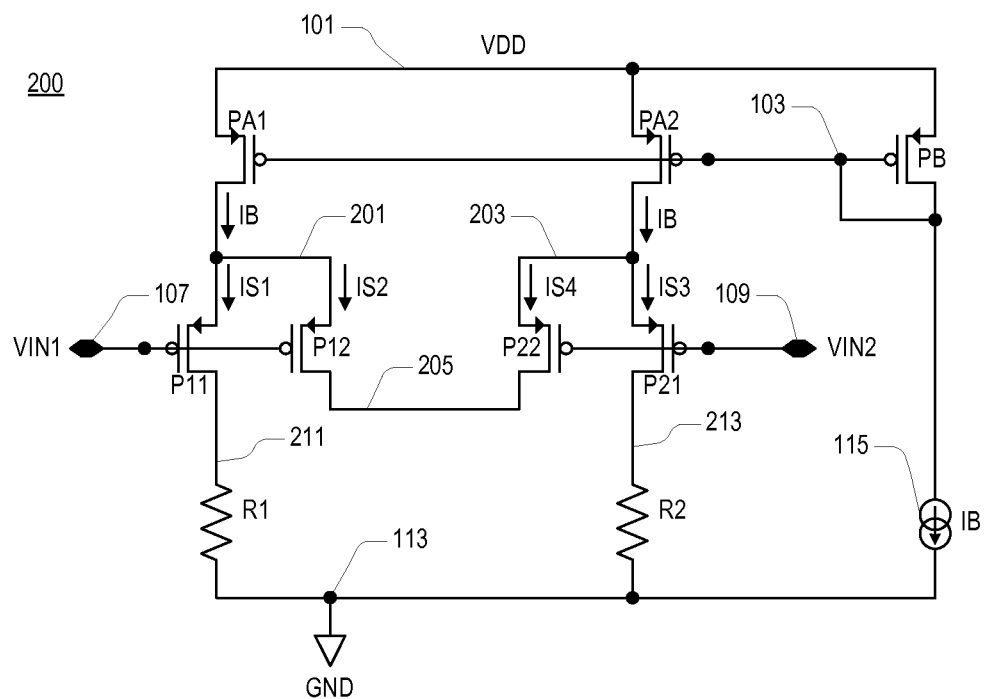
FIG. 2 is a schematic diagram of a high voltage MOS differential input stage implemented according to one embodiment of the present invention incorporating input gate protection.

FIG. 2 is a schematic diagram of a high voltage MOS differential input stage 200 implemented according to one embodiment of the present invention incorporating input gate protection. The high voltage MOS differential input stage 200 includes PMOS devices (or FETs) PA1, PA2, PB, P11, P12, P21 and P22, the current source 115 and the load resistors R1 and R2. The current source 115 and PB are coupled together in similar manner between nodes 101 and 113 and to bias node 103 in which PB is diode-coupled to mirror bias current in a similar manner. Although the high voltage MOS differential input stage 200 is shown with load resistors (R1 and R2), it is understood that other types of load devices may be used, such as transistors or the like.

In this case, PA is replaced by two PMOS devices PA1 and PA2, each having a source coupled to node 101 and a gate coupled to the bias node 103. The drain of PA1 is coupled to a source node 201 and the drain of PA2 is coupled to a source node 203. P1 is replaced by P11 and P12, in which the sources of P11 and P12 are coupled to the source node 201. P2 is replaced by P21 and P22, in which the sources of P21 and P22 are coupled to the source node 203. The gates of P11 and P12 are coupled to the input node 107 receiving the input voltage VIN1 and the gates of P21 and P22 are coupled to the input node 109 receiving the input voltage VIN2. The drain of P11 is coupled to one end of the resistor R1 at a first output node 211 and the drain of P21 is coupled to one end of the resistor R2 at a second output node 213. The other ends of R1 and R2 are coupled to GND at node 113. The drains of P12 and P22 are coupled together at an intermediate node 205.

The source current of P11 is a current IS1 flowing from source node 201, the source current of P12 is a current IS2 flowing from source node 201, the source current of P21 is a current IS3 flowing from source node 203, and the source current of P22 is a current IS4 flowing from source node 203.

The PMOS devices PA1 and PA2 are coupled in a mirror configuration with PB so that the bias current IB developed by the bias current source 115 is mirrored into the source nodes 201 and 203. In the illustrated embodiment, PA1 and PA2 are both sized relative to PB to provide the same bias current IB to the source nodes 201 and 203. In one embodiment, for example, PA1, PA2 and PB are the same size or otherwise include the same number of parallel-coupled devices of the same size.

The high voltage MOS differential input stage 200 incorporates gate protection which is configured to protect the input devices by always keeping both P11 and P21 on. Consider operation of the input devices P11 and P21 when VIN1 and VIN2 are equal. It is first noted that since PA1 and PA2 each supply a bias current of IB, the total bias current is the same as in the conventional circuit (2IB) except split between two branches. Assuming that P11 and P21 are matched, their source voltages at nodes 201 and 203, respectively, are the same so that no current flows between nodes 201 and 203. Thus, the source currents of both P11 and P21 flow through their drains to the load resistors R1 and R2, respectively. The output nodes 211 and 213 have the same voltage assuming that the resistances of R1 and R2 are equal.

It is noted that P11 and P12 have their sources and gates connected together and that P21 and P22 also have their sources and gates connected together. When VIN1 and VIN2 are sufficiently close to each other, say within 50 millivolts (mV), then P12 and P22 are both in the "triode" region of operation. More specifically, P12 and P22 both behave like resistors. In this condition, however, P11 and P21 are in the "active" region of operation.

When instead VIN1 and VIN2 are "far" apart in voltages otherwise indicating a fault condition, such as separated by 5V or more, operation responds in order to protect the input devices. Consider the above example in which VIN1 is 10V and VIN2 is 0V. PA1 is supplying a current of "IB" into the sources of P11 and P12 at source node 201. If P11 and P12 are identical, the current splits with half the current flowing through P11 and the other half flowing through P12. Both of these devices are now in the active region of operation. A bias current of IB is also flowing into the common sources of P21 and P22 at source node 203. Whereas P12 is in the active region of operation, P22 is in the triode region of operation and thus still behaves like a resistor. Therefore, the drain current of P12 flows through P22, operating similar to a resistor, to node 203 and this current is added to the source current of P21. Thus, the current flowing through P21 is now 1.5×IB. This increases the source-gate voltage of both P22 and P21 which decreases the drain-source resistance of P22.

Operation is similar when the input voltages are reversed, that is, when VIN1 is 0V and VIN2 is 10V. In this case, P21 and P22 are active whereas P12 operates in the triode region and behaves like a resistor. About half of the bias current IB flows through P22 to P12 so that a current of 1.5·IB flows through P11.

In one embodiment, P11, P12, P21 and P22 have the same width (W) per length (L) ratio, or W/L. With devices having the same W/L ratio, the differential output current is 1.5×IB−0.5×IB=IB. In another embodiment, P12 and P21 do not have the same channel values as P11 and P22, respectively. In one embodiment, P12 and P22 are short channel FETs, which means that their lengths are reduced relative to their widths as compared to that of P11 and P12. In this manner, for the stated fault condition in which the input voltages are separated by a significant amount and VIN1>VIN2, P12 receives a greater amount of the bias current provided by PA1. Also, when the input voltages are separated by a significant amount and VIN2>VIN1, P22 receives a greater amount of the bias current provided by PA2. The sizing of P12 and P22 relative to P11 and P21 allows a greater amount of bias current to flow through the intermediate node 205 to enable a larger differential output signal. Using short channel FETs allows the differential output current to increase above IB and approach 2IB.

A simple formula for the drain current $I_d$ of MOSFETs that are in their active region of operation is according to equation (1):

$$I_d = \mu C_{ox}/2 \times W/L \times (V_{gs}-V_t)^2 \qquad (1)$$

where "$\mu$" is the mobility, $C_{ox}$ is the oxide capacitance, W is the width of the FET's channel, L is its channel length, $V_{gs}$ is the gate-source voltage, and $V_t$ is the threshold voltage. In the triode mode region operation is according to equation (2):

$$I_d = \mu C_{ox}/2 \times W/L \times [2(V_{gs}-V_t) \times V_{ds} - V_{ds}^2] \qquad (2)$$

where $V_{ds}$ is the drain-source voltage. It is noted that if $V_{ds} = (V_{gs}-V_t)$, then the two equations are the same. For simplicity's sake, let $\mu C_{ox}/2 \times W/L = K$. Then equations (1) and (2) may be re-written as the following two equations (3) and (4):

$$I_d = K \times (V_{gs}-V_t)^2 \text{ and} \qquad (3)$$

$$I_d = K \times [2(V_{gs}-V_t) \times V_{ds} - V_{ds}^2] \qquad (4)$$

where equation (4) may further be re-written as the following equation (5):

$$I_d \approx K \times [2(V_{gs}-V_t) \times V_{ds}] \qquad (5)$$

if $V_{ds}$ is small compared with $2(V_{gs}-V_t)$, and where "$\approx$" denotes an approximation.

In the active region the transconductance ($g_m$) of the FET is $\partial I_d/\partial V_{gs}$ or $2K \times (V_{gs}-V_t)$. In the triode region $I_d/V_{ds}$ is $\approx 2K \times (V_{gs}-V_t)$ which is the same as in the active mode. Note that these results are for substantially identical FETs since they have the same K value (in other words, W/L is the same for the FETs). If W/L for a given FET is increased, like in the short channel FET, then the corresponding $g_m$ is larger and the corresponding ON resistance ($1/g_m$) is smaller for the FET. Reducing the ON resistance of the intermediate devices P12 and P22 relative to the outer devices P11 and P21 allows greater current flow through intermediate node 205 providing a greater range for the differential output current.

Figure 3:
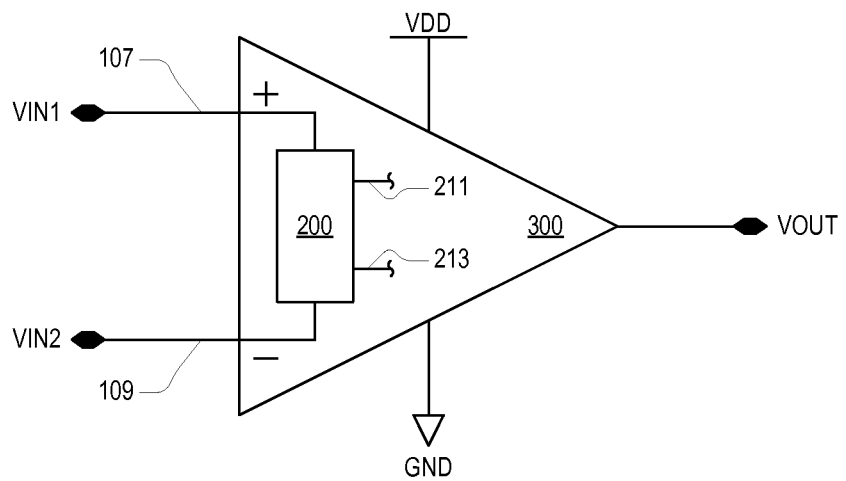
FIG. 3 is a simplified diagram of an amplifier incorporating the high voltage MOS differential input stage of FIG. 2.

FIG. 3 is a simplified diagram of an amplifying device 300 incorporating the high voltage MOS differential input stage 200. The amplifying device 300 represents any type of amplifier or comparator, such as an operational amplifier, transconductance amplifier, comparator, etc. The amplifying device 300 includes a positive (+) or non-inverting input receiving VIN1 and a negative (−) or inverting input receiving VIN2 internally provided across the high voltage MOS differential input stage 200 incorporated within the amplifying device 300. The high voltage MOS differential input stage 200 develops internal output voltages on nodes 211 and 213. The amplifying device 300 also receives the source voltages VDD and GND. The output portion of the amplifying device 300 is not shown. A single-ended output VOUT is shown at the output of the amplifying device 300, although a differential output is also contemplated.

Although the high voltage MOS differential input stage 200 is particularly advantageous as the input stage of an amplifying device, such as an amplifier or comparator or the like, it is understood that it may be used for any circuit having a differential input. The high voltage MOS differential input stage 200 may be implemented in a discrete circuit or implemented on an integrated circuit (IC) or the like.

Figure 4:
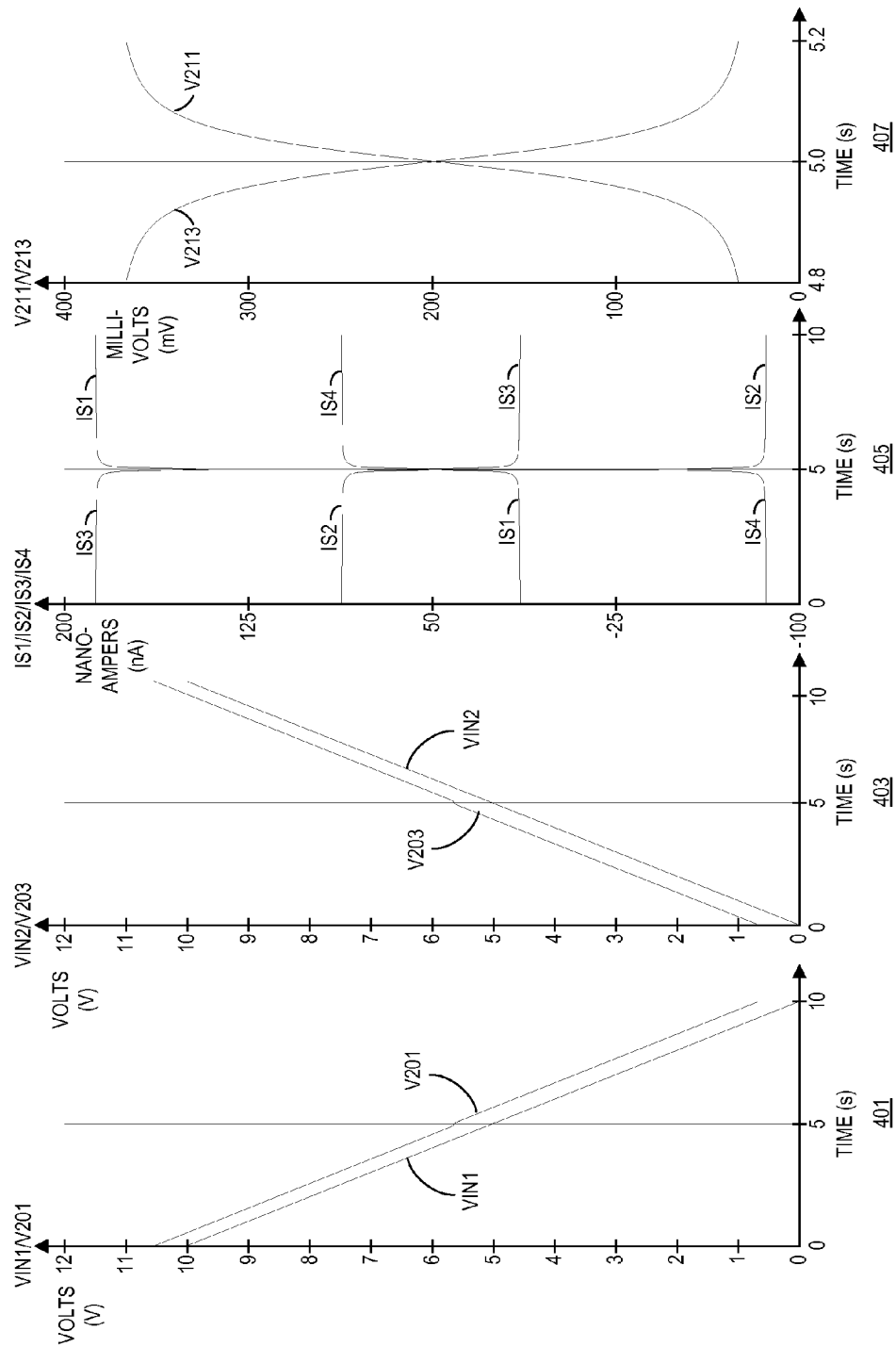
FIG. 4 shows a series of simulation timing diagrams illustrating operation of the high voltage MOS differential input stage of FIG. 2.

FIG. 4 shows a series of simulation timing diagrams illustrating operation of the high voltage MOS differential input stage 200. The first graph 401 plots the voltage of VIN1 and the corresponding voltage of node 201, labeled V201, in Volts (V), the second graph 403 plots VIN2 and the corresponding voltage of node 203, labeled V203, in Volts (V), the third graph 405 plots the corresponding source voltages IS1, IS2, IS3 and IS4 in response to application of the VIN1 and VIN2 voltages of plots 401 and 403, in nano-amperes (nA), and the fourth graph 407 plots the corresponding voltages of the output nodes 211 and 213, labeled V211 and V213, respectively, in response to application of the VIN1 and VIN2 voltages of plots 401 and 403, in milli-volts (mV), all versus time (in seconds, s).

For this simulation, the bias current IB is approximately 100 nA. The load resistors R1 and R2 are each approximately 2 megohms (MΩ).

For the simulation, the voltage of VIN1 is linearly swept from 10V to 0V for a time period of 10 seconds, while the voltage of VIN2 is linearly swept in the opposite direction from 0V to 10V during the same time period. In this manner, VIN1 starts at 10V while VIN2 starts at 0V which would violate the maximum gate voltage rating of input device P1 in the conventional MOS differential input stage 100. For the high voltage MOS differential input stage 200, however, the voltage V201 of the source node 201 remains at about 0.5V above VIN1 while VIN1 sweeps from 10V to just above about 5V. When the voltages of VIN1 and VIN2 are close near 5V at about 5 seconds, both V201 and V203 experience a slight non-linearity. After 5 seconds, V201 remains at about 0.65V above VIN1 while VIN1 continues to sweep from about 5V down to 0V.

Since the source voltage V201 of P11 essentially tracks its gate voltage well below the 5V fault voltage, the gate-source voltage rating is not exceeded regardless of the input voltage range between VIN1 and VIN2 (within the supply voltage range).

As shown by graph 403, V203 also tracks the voltage of VIN2 which is swept in the opposite direction from 0V to 10V during the 10 second period. V203 starts at about 0.65V above VIN2, and ends up at about 0.5V above VIN2 in a similar albeit opposite manner as described for V201 and VIN1. Since the source voltage V203 of P21 also tracks its gate voltage well below the 5V fault voltage, the gate-source voltage rating is not exceeded regardless of input voltage range applied between VIN1 and VIN2 (within the supply voltage range).

As shown by graph 405, while VIN1 is greater than VIN2, IS1 is about 14 nA, IS2 is about 86 nA, IS3 is about 186 nA, and IS4 is about −86 nA. During the entire time, IS1+IS2=100 nA, and IS3+IS4=100 nA. IS1, which is the source current for P11, illustrates that P11 remains on during this otherwise initial fault condition. P12 receives most of the bias current IB (100 nA−14 nA=86 nA) which flows through P22 (−86 nA) to combine with IB (100 nA) to increase IS3 (186 nA).

When VIN1 and VIN2 approach the same voltage level (~5V) at about 5 seconds into the simulation, the source currents begin to reverse. IS1 increases while IS2 decreases until IS1 rises to about 186 nA while IS2 decreases to about −86 nA after 5 seconds. Meanwhile, IS3 decreases from 186 nA to about 14nA while IS4 increases from −86 nA to about 86 nA. Again, during the entire time, IS1+IS2=100 nA and IS3+IS4=100 nA. Near the end of the simulation, IS3, which is the source current for P21, illustrates that P21 remains on during this otherwise initial fault condition. P22 receives most of the bias current IB (100 nA−14 nA=86 nA) which flows through P12 (−86 nA) to combine with IB (100 nA) to increase IS1 (186 nA).

Graph 407 illustrates the corresponding output voltages V211 and V213 during the simulation. V211 is initially about 28 mV and V213 is about 372 mV while VIN1>VIN2. As VIN1 approaches the same voltage level as VIN2, V211 increases while V213 decreases by the same amount so that the voltage levels effectively reverse. Thus, V211 increases to about 372 mV while V213 decreases to about 28 mV. Since the combined bias currents remain constant (2IB), V211+V213 remains constant at about 400 mV during the simulation (assuming constant load resistance of 2 MΩ each).

It is noted that although the high voltage MOS differential input stage 200 is illustrated using PMOS transistor devices, operation is substantially similar for configuration using N-type or N channel (NMOS) transistor devices. The NMOS configuration is essentially implemented by replacing the PMOS devices with NMOS devices, by swapping the reference voltages (VDD to GND, and GND to VDD), and by reversing direction of the bias current IB of the current source 115 as understood by those skilled in the art. Operation is substantially similar. It is noted that PMOS devices may be better matched than corresponding NMOS devices providing more accurate results for the PMOS configuration illustrated.

It is noted that although the high voltage MOS differential input stage 200 is illustrated using PMOS transistor devices rated at about 18V (drain-source) with maximum gate voltages of 5V and using VDD of 12V, operation is substantially the same for other voltage ranges and ratings. The present invention is useful to protect higher voltage devices (e.g., 100V or more) with correspondingly lower maximum gate voltage ratings. The bias currents and load resistors may be suitably adjusted for any configuration.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A differential input stage, comprising:
   a first input circuit, comprising:
      a first transistor having a first current terminal coupled to a first source node, having a second current terminal coupled to a first output node, and having a control terminal coupled to a first input node; and
      a second transistor having a first current terminal coupled to said first source node, having a second current terminal coupled to an intermediate node, and having a control terminal coupled to said first input node;
   a second input circuit, comprising:
      a third transistor having a first current terminal coupled to a second source node, having a second current terminal coupled to a second output node, and having a control terminal coupled to a second input node; and
      a fourth transistor having a first current terminal coupled to said second source node, having a second current terminal coupled to said intermediate node, and having a control terminal coupled to said second input node;
   a load circuit coupled between said first and second output nodes and a first supply node; and
   a bias circuit coupled to said first supply node and a second supply node that develops a first bias current at said first source node and that develops a second bias current to said second source node.

2. The differential input stage of claim 1, wherein said first, second, third and fourth transistors comprise PMOS transistors.

3. The differential input stage of claim 1, wherein said first, second, third and fourth transistors comprise NMOS transistors.

4. The differential input stage of claim 1, wherein said first, second, third and fourth transistors have thin gate oxide.

5. The differential input stage of claim 1, wherein a W/L ratio of said second and fourth transistors is different than a W/L ratio of said first and third transistors.

6. The differential input stage of claim 1, wherein said second and fourth transistors are short channel field-effect transistors.

7. The differential input stage of claim 1, wherein said first and third transistors are matched with each other and wherein said second and fourth transistors are matched with each other.

8. The differential input stage of claim 1, wherein said load circuit comprises a first resistor coupled between said first output node and said first supply node and a second resistor coupled between said second output node and said first supply node.

9. The differential input stage of claim 1, wherein said bias circuit comprises:
   a fifth transistor having a first current terminal coupled to said second supply node, and having a second current terminal and a control terminal coupled together at a bias node;
   a bias current source coupled between said bias node and said first supply node;
   a sixth transistor having a first current terminal coupled to said second supply node, having a control terminal coupled to said bias node, and having a second current terminal coupled to said first source node; and
   a seventh transistor having a first current terminal coupled to said second supply node, having a control terminal coupled to said bias node, and having a second current terminal coupled to said second source node.

10. The differential input stage of claim 9, wherein said fifth, sixth and seventh transistors are configured to mirror a bias current generated by said bias current source as a first bias current into said first source node and as a second bias current into said second source node.

11. The differential input stage of claim 10, wherein said first and second bias currents are substantially equal.

12. An amplifying device, comprising:
   a differential input comprising first and second input nodes;
   first and second supply nodes; and
   a differential input stage coupled to said differential input, comprising:
      a first transistor having a first current terminal coupled to a first source node, having a second current terminal coupled to a first output node, and having a control terminal coupled to said first input node;

a second transistor having a first current terminal coupled to said first source node, having a second current terminal coupled to an intermediate node, and having a control terminal coupled to said first input node;

a third transistor having a first current terminal coupled to a second source node, having a second current terminal coupled to a second output node, and having a control terminal coupled to said second input node;

a fourth transistor having a first current terminal coupled to said second source node, having a second current terminal coupled to said intermediate node, and having a control terminal coupled to said second input node;

a load circuit coupled between said first and second output nodes and said first supply node; and a bias circuit coupled to said first and second supply nodes that develops a first bias current at said first source node and that develops a second bias current to said second source node.

13. The amplifying device of claim 12, wherein said amplifying device comprises an operational amplifier.

14. The amplifying device of claim 12, wherein said amplifying device comprises a comparator.

15. The amplifying device of claim 12, wherein said first, second, third and fourth transistors comprise PMOS transistors.

16. The amplifying device of claim 12, wherein said first, second, third and fourth transistors comprise NMOS transistors.

17. The amplifying device of claim 12, wherein said first, second, third and fourth transistors have thin gate oxide.

18. The amplifying device of claim 12, wherein a W/L ratio of said second and fourth transistors is different than a W/L ratio of said first and third transistors.

19. The amplifying device of claim 12, wherein said second and fourth transistors are short channel field-effect transistors.

20. The amplifying device of claim 12, wherein said bias circuit comprises:

a fifth transistor having a first current terminal coupled to said second supply node, and having a second current terminal and a control terminal coupled together at a bias node;

a bias current source coupled between said bias node and said first supply node;

a sixth transistor having a first current terminal coupled to said second supply node, having a control terminal coupled to said bias node, and having a second current terminal coupled to said first source node; and a seventh transistor having a first current terminal coupled to said second supply node, having a control terminal coupled to said bias node, and having a second current terminal coupled to said second source node.

21. The amplifying device of claim 20, wherein said fifth, sixth and seventh transistors are configured to mirror a bias current generated by said bias current source as a first bias current into said first source node and as a second bias current into said second source node.

22. The amplifying device of claim 21, wherein said first and second bias currents are substantially equal.

\* \* \* \* \*